United States Patent
Jang et al.

(10) Patent No.: US 6,297,162 B1
(45) Date of Patent: Oct. 2, 2001

(54) METHOD TO REDUCE SILICON OXYNITRIDE ETCH RATE IN A SILICON OXIDE DRY ETCH

(75) Inventors: Syun-Ming Jang, Hsin-Chu; Chu-Yan Fu; Yuan-Hung Chiu, both of Taipei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/407,109

(22) Filed: Sep. 27, 1999

(51) Int. Cl.$^7$ .................................................. H01L 21/302
(52) U.S. Cl. .................... 438/706; 438/711; 438/723; 438/724; 438/743; 438/744
(58) Field of Search .................... 438/706, 711, 438/723, 724, 743, 744, 257

(56) References Cited

U.S. PATENT DOCUMENTS

| | | | |
|---|---|---|---|
| 5,188,704 | 2/1993 | Babie et al. | 156/643 |
| 5,198,392 | 3/1993 | Fukuda et al. | 437/241 |
| 5,536,681 | 7/1996 | Jang et al. | 437/195 |
| 5,766,974 | 6/1998 | Sardella et al. | 437/195 |
| 5,930,627 | * 7/1999 | Zhou et al. | 438/257 |
| 6,004,873 | * 12/1999 | Jang et al. | 438/628 |
| 6,069,077 | * 5/2000 | Lee et al. | 438/675 |
| 6,140,266 | * 10/2000 | Grill et al. | 438/637 |

* cited by examiner

Primary Examiner—Benjamin L. Utech
Assistant Examiner—Binh X. Tran
(74) Attorney, Agent, or Firm—George O. Saile; Stephen B. Ackerman; Rosemary L. S. Pike

(57) ABSTRACT

A method to improve silicon oxynitride when used as an etching stop for silicon oxide plasma etching, by nitridizing with a nitrogen plasma, in the fabrication of an integrated circuit is achieved. The method is applied to forming etch stopping silicon oxynitride spacers for MOS transistors and for forming etch stopping silicon oxynitride for dual damascene interconnects. A semiconductor substrate is provided wherein devices and features have been formed in and on the semiconductor substrate. A silicon oxynitride layer is deposited overlying the semiconductor substrate. The silicon oxynitride layer is nitridized. An interlevel dielectric oxide layer is deposited overlying surface of the silicon oxynitride layer. The interlevel dielectric oxide layer is etched through to the silicon oxynitride layer where defined by photolithography and wherein the silicon oxynitride layer acts as an etching stop. The exposed silicon oxynitride layer is etched through to expose the top surface of the underlying semiconductor substrate. The integrated circuit is completed.

6 Claims, 7 Drawing Sheets

METHOD TO REDUCE SILICON OXYNITRIDE ETCH RATE IN A SILICON OXIDE DRY ETCH

BACKGROUND OF THE INVENTION (1) Field of the Invention

The invention relates to a method of fabricating semiconductor devices, and more particularly to the use of silicon oxynitride as an etching stop for silicon oxide etching.

(2) Description of the Prior Art

A variety of thin film materials are used in integrated circuit manufacturing. One such thin film is silicon oxynitride (SiON). Silicon oxynitride is a material that is used as an insulator and as a diffusion barrier in some ultra large scale integration (ULSI) processes.

In addition, silicon oxynitride is used as a masking, or etch stop, layer in certain applications. Such uses rely on the relative etch rate of oxynitride when compared to other films. For example, if the proper reactive ion etch chemistry is selected, silicon oxide will exhibit a much higher etch rate than silicon oxynitride under the same etch conditions. This property is called selectivity. In the art, a high selectivity ratio allows a slow etching film type, in this case silicon oxynitride, to act as a mask and an etching stop for a fast etching film type, such as silicon oxide.

This oxide-to-oxynitride selectivity is used in the art to facilitate the etching of self-aligned contacts (SAC) for metal oxide semiconductor (MOS) transistor gates. Referring to FIG. 1, a cross section of a partially completed prior art integrated circuit is shown. On a substrate 10, two MOS transistor gates are shown. Each MOS gate has a gate oxide 14, polysilicon gate node 18, and silicon nitride sidewalls 22. A thin layer of silicon oxynitride 26 is shown overlying the MOS gates. Overlying the silicon oxynitride is an interlevel dielectric 30 (ILD) of silicon oxide.

Because the two MOS gates are very closely spaced, a special type of contact must be formed to connect the surface of the substrate 10 to circuitry above the ILD 30. A self-aligned contact, or SAC, allows the contact hole to be made wider than the available space between the MOS gates. By using a SAC, a lithography and etch combination can be used to make contacts that are effectively smaller than the processes are capable of producing. The key to the SAC shown is the selectivity of oxide and oxynitride in the oxide dry etch process. By selecting the dry, or plasma, etch chemistry properly, the etch rate of the silicon oxynitride layer 26 can be made sufficiently smaller than that of the ILD oxide layer 30. When the ILD oxide is etched through to make the contact hole, the oxynitride will act as an etching stop to prevent the plasma etch from damaging the MOS gate or the substrate surface 10.

FIG. 2 and FIG. 3 show two potential problems with the conventional art. To achieve ULSI, the minimum space between the two MOS gates must be as small as possible. The silicon oxynitride layer 26 must also be kept very thin. Referring to FIG. 2, if the layer is made too thin, however, it will not be sufficiently thick enough to stop the silicon oxide etch and protect the underlying MOS gates. The MOS gates will be damaged 35 by the etch. On the contrary, if the silicon oxynitride 26 is made thicker, this causes problems with gap filling of the ILD film 30. Referring to FIG. 3, voids 40 can form in the ILD layer 30 if the silicon oxynitride layer 26 is too thick relative to the space available between the MOS gates. Additionally, if the silicon oxynitride is formed using a plasma enhanced deposition process, plasma and hydrogen damage to underlying films is increased as the thickness of the silicon oxynitride film increases.

A second prior art application of this type of etch stop is a dual damascene trench as shown in FIG. 4. A first dielectric layer 43 is deposited overlying a semiconductor substrate 41. First conductive traces 42, typically of copper, are formed in the first dielectric layer 43. A diffusion barrier layer 44 is deposited overlying the first conductive traces 42 and the first dielectric layer 43. The diffusion barrier layer 44 also serves as an etching stop. A second dielectric layer 45 is deposited overlying the diffusion barrier layer 44. An etch stop layer 46 is deposited overlying the second dielectric layer 45. Finally, a third dielectric layer 47 is deposited overlying the etch stop layer 46.

As in the previous example, either silicon nitride or silicon oxynitride may be used in this application. Particularly, the diffusion barrier layer 44 and the etch stop layer 46 may be comprised of either silicon nitride or silicon oxynitride. The trench and via etches for the dual damascene structure require an etching stop above the first conductive traces 42 and the second dielectric layer 45. Again, a trade-off must be made. Silicon nitride has excellent selectivity but a relatively high dielectric constant. Use of silicon nitride will increase the capacitance of dual damascene interconnects. Alternatively, silicon oxynitride exhibits a lower dielectric constant. However, a thicker layer must be used to effectively stop the etch.

Several prior art approaches use silicon oxynitride and nitridized silicon oxide to improve integrated circuit processes. U.S. Pat. No. 5,536,681 to Jang et al teaches a method to improve the gap filling capability of $O_3$-TEOS over a plasma enhanced silicon oxide by selectively treating the PE-oxide with $N_2$ plasma. U.S. Pat. No. 5,766,974 to Sardella et al discloses a technique to eliminate damage to interlevel dielectric due to metal overetch by using an oxynitride layer as a metal etch stop. U.S. Pat. No. 5,198,392 to Fukuda et al teaches a process to form an oxynitride film by nitridizing a previously formed silicon dioxide film with nitrous oxide. U.S. Pat. No. 5,188,704 to Babie et al discloses a two-step process to selectively etch silicon nitride where silicon oxynitride overlies silicon nitride that also overlies silicon oxide.

SUMMARY OF THE INVENTION

A principal object of the present invention is to provide an effective and very manufacturable method to improve the capability of silicon oxynitride as an etch stop for silicon oxide dry etching in the manufacture of integrated circuits.

A further object of the present invention is to provide a method to reduce the etch rate of silicon oxynitride in silicon oxide dry etching by nitridizing the silicon oxynitride.

A still further object of the present invention is to provide a method for improving self-aligned contact processes by nitridizing the silicon oxynitride to reduce the silicon oxynitride etch rate in silicon oxide dry etching.

Another further object of the present invention is to provide a method for improving dual damascene interconnects processes by forming a nitridized silicon oxynitride etch stop.

In accordance with the objects of this invention, a new method to improve the capability of silicon oxynitride as an etching stop in silicon oxide plasma etching is achieved. A semiconductor substrate is provided. Devices, such as MOS transistors, are provided in and on the substrate. A layer of plasma enhanced silicon oxynitride is deposited overlying the desired features and devices. A nitrogen plasma treatment is performed on the silicon oxynitride layer to nitridize the top surface and thereby reduce the etch rate of the silicon oxynitride layer when exposed to a silicon oxide plasma etch environment. A layer of silicon oxide is deposited overlying the silicon oxynitride layer. The silicon oxide layer is plasma etched through to the silicon oxynitride in areas defined by photolithographic process to define contact holes. The silicon oxynitride layer that acted as an etching stop for the oxide etch is then etched to complete the contact holes. A metal layer is deposited overlying the silicon oxide and filling contacts. This metal layer is etched to define connective features. A plasma nitride layer is formed overlying the metal layer and silicon oxide layer. This completes the fabrication of the integrated circuit.

Also in accordance with the objects of this invention, a new method to improve the capability of silicon oxynitride as an etching stop in a dual damascene structure is achieved. A first dielectric layer is deposited overlying a semiconductor substrate. First conductive traces are formed in the first dielectric layer. A diffusion barrier layer of silicon nitride is deposited overlying the first dielectric layer and the first conductive traces. As an option to improve the etch stopping capability of the diffusion barrier layer, a first etch stop layer of silicon oxynitride is deposited overlying the diffusion barrier layer. A nitrogen plasma treatment is performed on the first etch stop layer to nitridize the silicon oxynitride and to reduce the etch rate of the silicon oxynitride in a silicon dioxide plasma etch environment. A second dielectric layer is deposited overlying the first etch stop layer. A second etch stop layer of silicon oxynitride is deposited overlying the second dielectric layer. A nitrogen plasma treatment is performed on the second etch stop layer to nitridize the silicon oxynitride and to reduce the etch rate of the silicon oxynitride in a silicon dioxide plasma etch environment. A third dielectric layer is deposited overlying the second etch stop layer. The third dielectric layer is patterned to form trenches for planned second conductive traces. The second etch stop layer stops the third dielectric layer etch. The second etch stop layer and second dielectric layer are patterned to form vias. The first etch stop layer stops the second dielectric layer etch. The first etch stop layer and the diffusion barrier layer are etched through to expose the first conductive traces. A metal layer of copper is deposited overlying the third dielectric layer and filling the vias and trenches. The metal layer is polished down to complete the dual damascene interconnect, and the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 5:
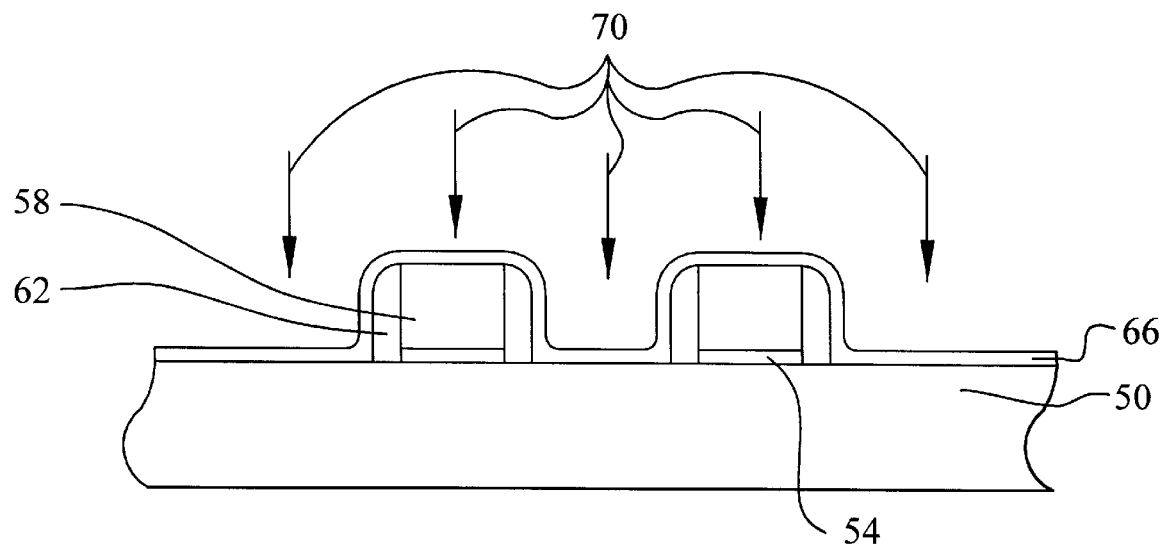
FIGS. 5 through 8 schematically illustrate in cross-sectional representation a first preferred embodiment of the present invention applied to the formation of MOS transistors.

Referring now more particularly to FIG. 5, the first embodiment of the present invention is shown. There is illustrated a cross section of a partially completed integrated circuit. Semiconductor substrate 50 is preferably composed of monocrystalline silicon. MOS transistor gates have been conventionally formed with thin gate oxide 54, polysilicon gate nodes 58, and silicon nitride sidewalls 62.

A thin layer of plasma enhanced silicon oxynitride (PE-SiON) 66 is deposited overlying the transistor gates and the substrate 50. The silicon oxynitride layer 66 is deposited preferably by a plasma enhanced low pressure chemical vapor deposition (PE-CVD) process to a thickness of between about 200 Angstroms and 500 Angstroms. It is important that the PE-SiON layer 66 be kept as thin as possible to improve the gap-filling capability of the interlevel dielectric layer that is later deposited. In addition, depositing less PE-SiON reduces the amount of plasma and hydrogen damage done during the deposition process.

Next, a key part of the present invention is described. The silicon oxynitride film is nitridized 70 by exposing the wafer to a $N_2$ plasma treatment. The $N_2$ plasma is preferably generated using mixed-frequency radio frequency (RF) energy. RF energy is used in bands at about 13.56 MHz and about 350 kHz. The preferred $N_2$ plasma treatment nitridizes and densifies the surface of the silicon oxynitride layer 66 to a depth of between about 50 Angstroms and 100 Angstroms depending upon the treatment time.

The plasma etch rate of silicon oxide is about 11 times greater than that of conventionally formed PE-SiON. After the nitridizing step of the present invention, the plasma etch rate of the silicon oxynitride is reduced such that silicon oxide etches 16 times greater than the $N_2$-treated PE-SiON. Because of this improvement, the silicon oxynitride layer 66 is a better etching stop. Specifically, the nitrogen gas plasma nitridizing step comprises: nitrogen flowing at between about 400 sccm and 600 sccm, helium flowing at between about 1800 sccm and 2200 sccm, a chamber pressure of between about 1 Torr and 2 Torr, a first RF (13.56 MHz) power of between about 30 Watts and 70 Watts, a second RF (350 KHz) power of between about 400 Watts and 500 Watts, a spacing of between about 400 mils and 500 mils, and a temperature of between about 350 degrees C. and 430 degrees C.

Figure 6:
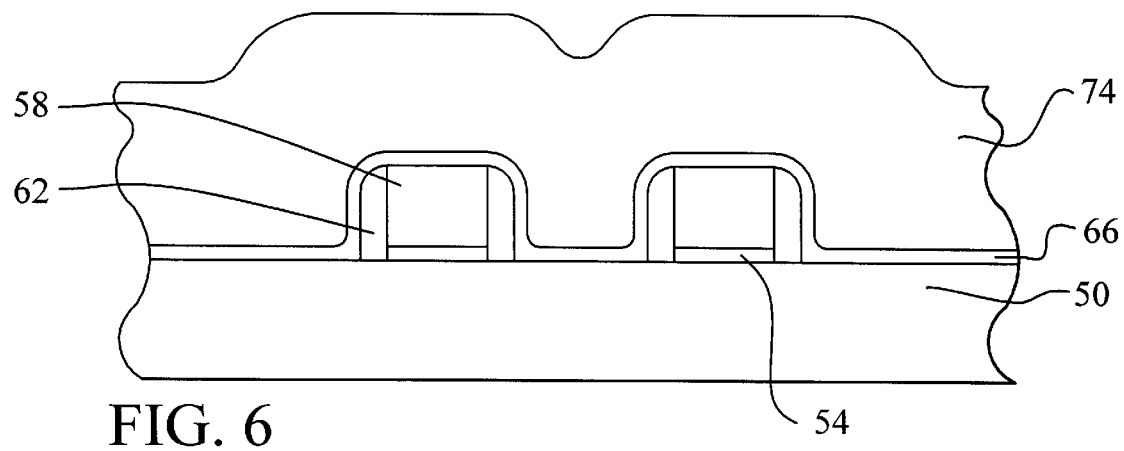

Referring now to FIG. 6, an interlayer dielectric oxide 74 is deposited overlying the silicon oxynitride layer 66. The interlayer dielectric oxide is a silicon oxide preferably deposited using tetraethyl orthosilicate (TEOS) and ozone ($O_3$) in a chemical vapor deposition reactor. Thus formed, the silicon oxide is called $O_3$-TEOS oxide. In addition, dopants are preferably added to the process to form a doped silicon oxide, such as borophosphosilicate $O_3$-TEOS, or BP $O_3$-TEOS. In the preferred embodiment, the BP $O_3$-TEOS is so deposited to a thickness of between about 1500 Angstroms to 3000 Angstroms.

Figure 7:
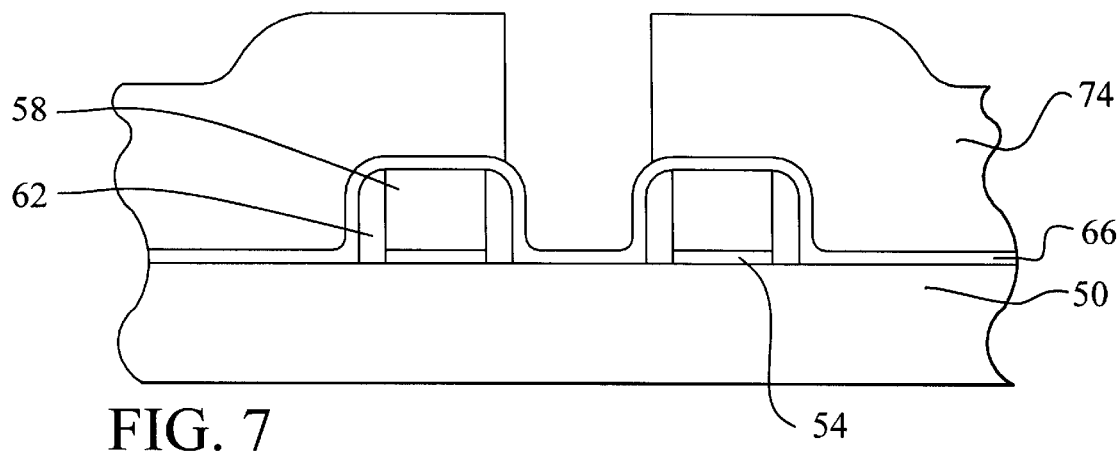

Referring now to FIG. 7, the interlevel dielectric oxide layer 74 is etched in areas defined by conventional photolithography. The etching is accomplished in a reactive ion etching (RIE) or high density plasma (HDP) reactor using an etch chemistry comprising: $CH_2F_2$, $C_4F_8$, $C_2F_6$, Ar, CO, and $CF_4$ at a pressure of between about 3 mTorr and 50 mTorr. Using this RIE/HDP chemistry, the interlevel dielectric layer 74 etch rate will be about 16 times greater than that of the underlying silicon oxynitride etching stop 66. As shown in FIG. 7, the interlevel dielectric layer 74 is etched through to the silicon oxynitride layer 66 to form the contact hole for the MOS transistor source or drain.

Figure 8:
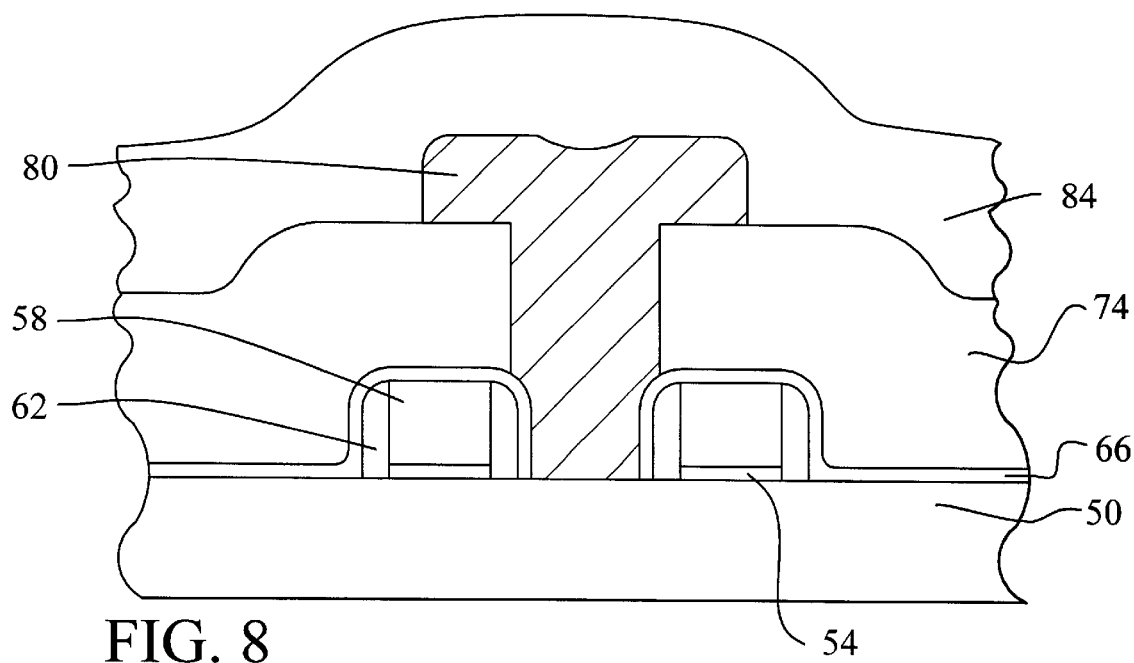

Referring now to FIG. 8, the exposed silicon oxynitride layer 66 overlying the substrate 50 in the contact hole is etched using a conventional RIE process. Next, a layer of metal 80 is deposited overlying the dielectric layer 74 and filling the contact. The metal layer is conventionally etched to form connective features. Finally, a layer of plasma nitride 84 is deposited overlying the metal layer 80 and the dielectric layer 74. This completes the fabrication of the integrated circuit device.

Figure 1:
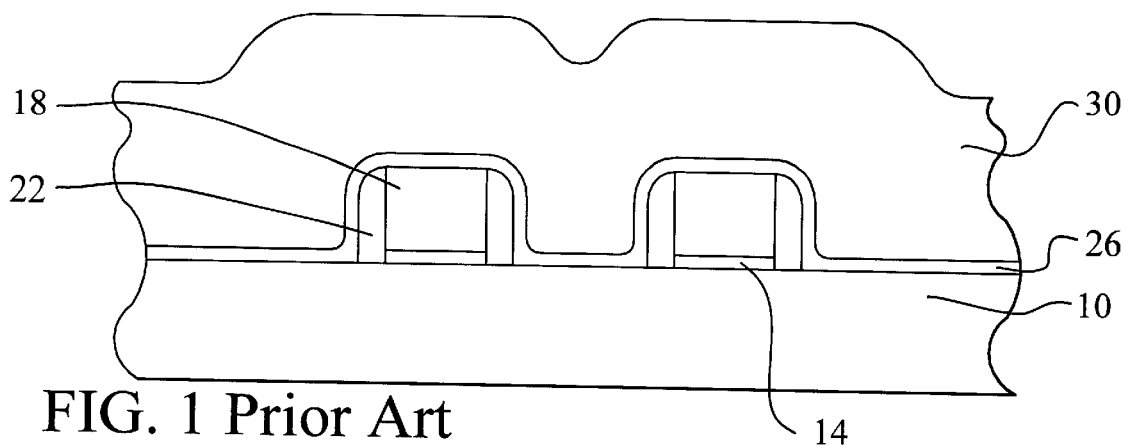
FIGS. 1 through 4 schematically illustrate in cross-section a partially completed prior art integrated circuit demonstrating problems in the prior art use of silicon oxynitride as an etching stop for silicon oxide plasma etching.
Figure 2:
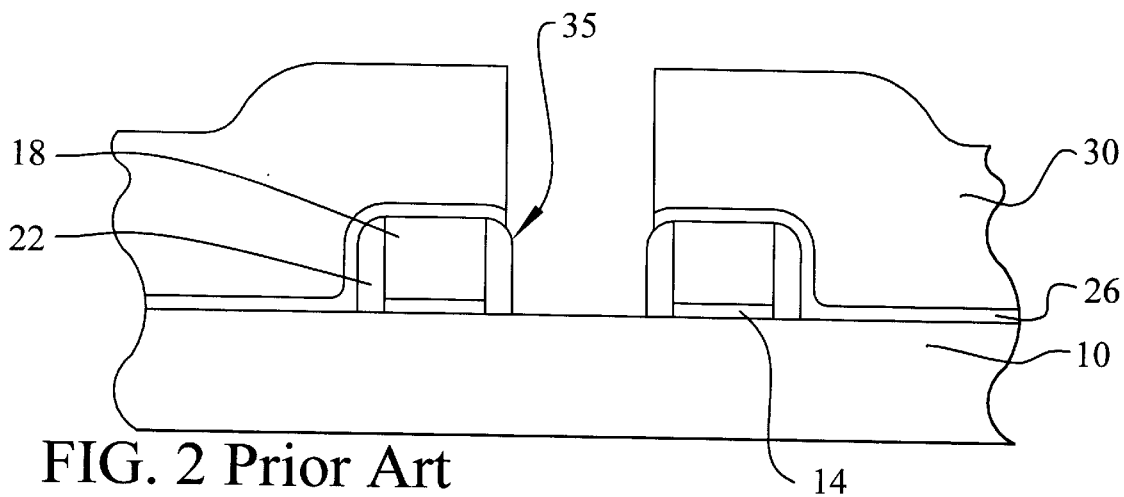
Figure 3:
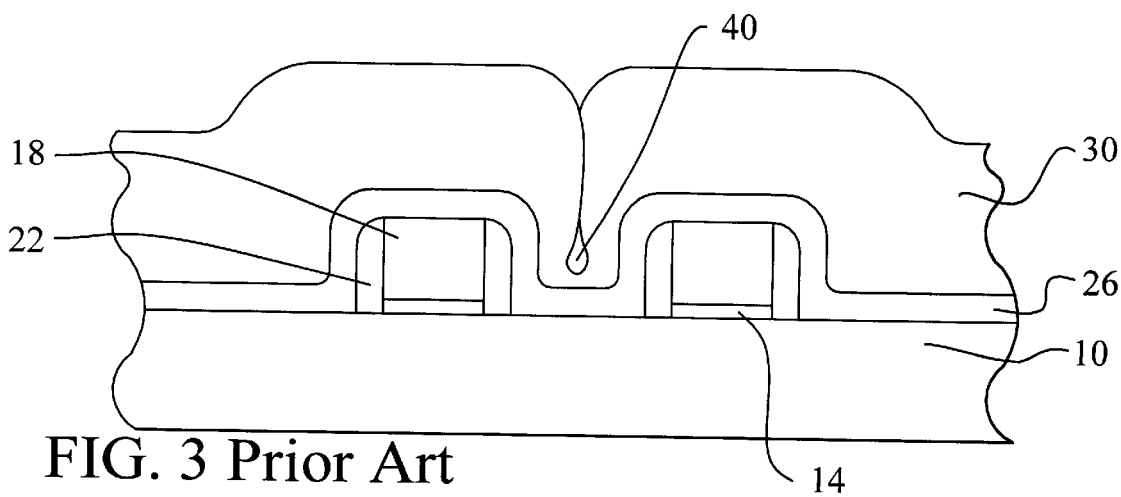
Figure 4:
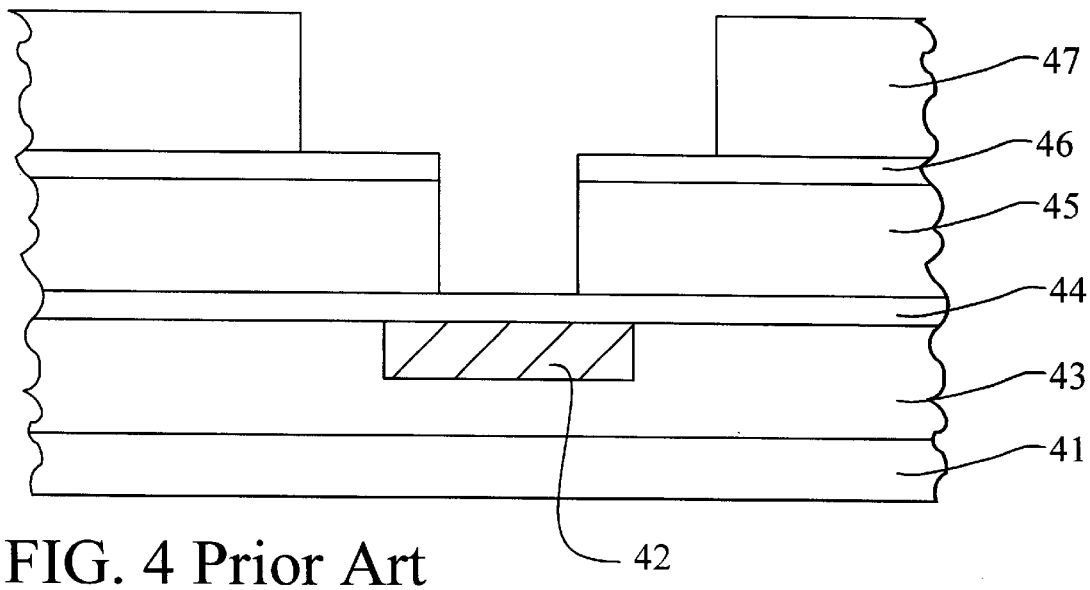

It can now be demonstrated how the first embodiment of the present invention represents a novel and useful improvement on the performance of the prior art. First, as shown in FIG. 7, the invention reduces the etch rate of the treated silicon oxynitride and thereby prevents the overetch damage depicted in FIG. 2. Second, the reduced etch rate of the present invention allows the silicon oxynitride layer to stay as thin as possible which promotes reliable gap-filling of the BP $O_3$-TEOS interlevel dielectric.

Figure 9:
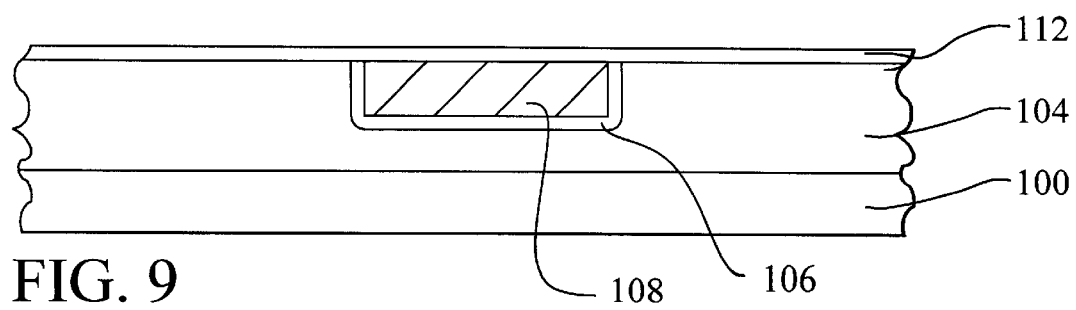
FIGS. 9 through 15 schematically illustrate in cross-sectional representation a second preferred embodiment of the present invention applied to the formation of dual damascene interconnects.

Referring now to FIG. 9, a second preferred embodiment of the present invention is disclosed. In the second preferred embodiment the present is applied to the fabrication of dual damascene interconnects. A semiconductor substrate 100 of monocrystalline silicon is provided. A first dielectric layer 104 is deposited overlying the semiconductor substrate 100. The first dielectric layer 104 conventionally comprises silicon dioxide. First conductive traces 108 are formed in the first dielectric layer 104. The first conductive traces 108 preferably comprise copper and are formed by a conventional damascene process. A barrier layer 106 underlies the copper to prevent out-diffusion of copper ions into the first dielectric layer 104.

A diffusion barrier layer 112 is deposited overlying the first dielectric layer 104 and the first conductive traces 108. The diffusion barrier layer 112 comprises silicon nitride which is deposited by plasma enhanced chemical vapor deposition (PE-CVD). The diffusion barrier layer 112 prevents out-diffusion of copper ions into the subsequently deposited second dielectric layer. The unique method of the present invention allows the diffusion barrier layer 112 to be thinner than in the prior art. The diffusion barrier layer 112 is deposited to a thickness of between about 400 Angstroms and 600 Angstroms.

Figure 10:
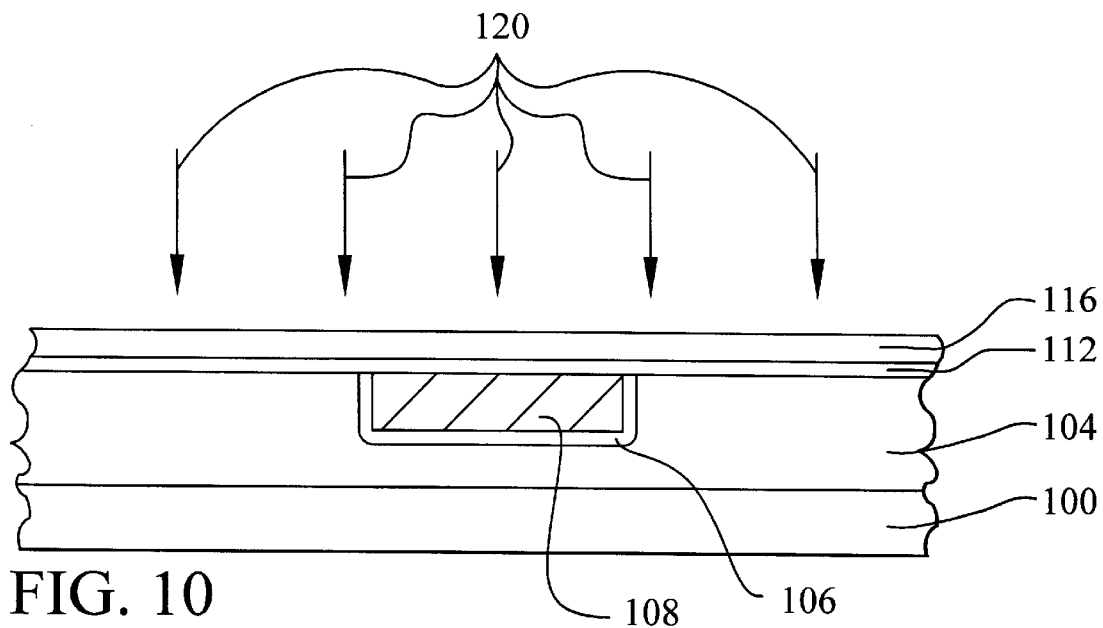

Referring now to FIG. 10, a first etch stop layer 116 is deposited overlying the diffusion barrier layer 112. The first etch stop layer 116 comprises silicon oxynitride deposited by plasma enhanced chemical vapor deposition (PE-CVD). The silicon oxynitride film is nitridized 120 by exposing the wafer to a $N_2$ plasma treatment. The $N_2$ plasma is preferably generated using mixed-frequency radio frequency (RF) energy. RF energy is used in bands at about 13.56 MHz and about 350 kHz. The preferred $N_2$ plasma treatment nitridizes and densities the surface of the silicon oxynitride layer 116 to a depth of between about 300 Angstroms depending upon the treatment time.

The final thickness of the first etch stop layer 116 is between about 1000 Angstroms and 1500 Angstroms. To achieve fully nitridized silicon oxynitride for the entire depth, the silicon oxynitride is deposited in several layers. Each layer is nitridized, then another layer is applied to build up the total thickness. This cycle may be repeated 2 to 5 times to complete the first etch stop layer 116. As in the first embodiment, the nitridizing process causes the silicon oxynitride to become more resistant to silicon dioxide dry etching. In addition, the presence of the nitridized silicon oxynitride allows the diffusion barrier layer 112 to be thinner.

Figure 11:
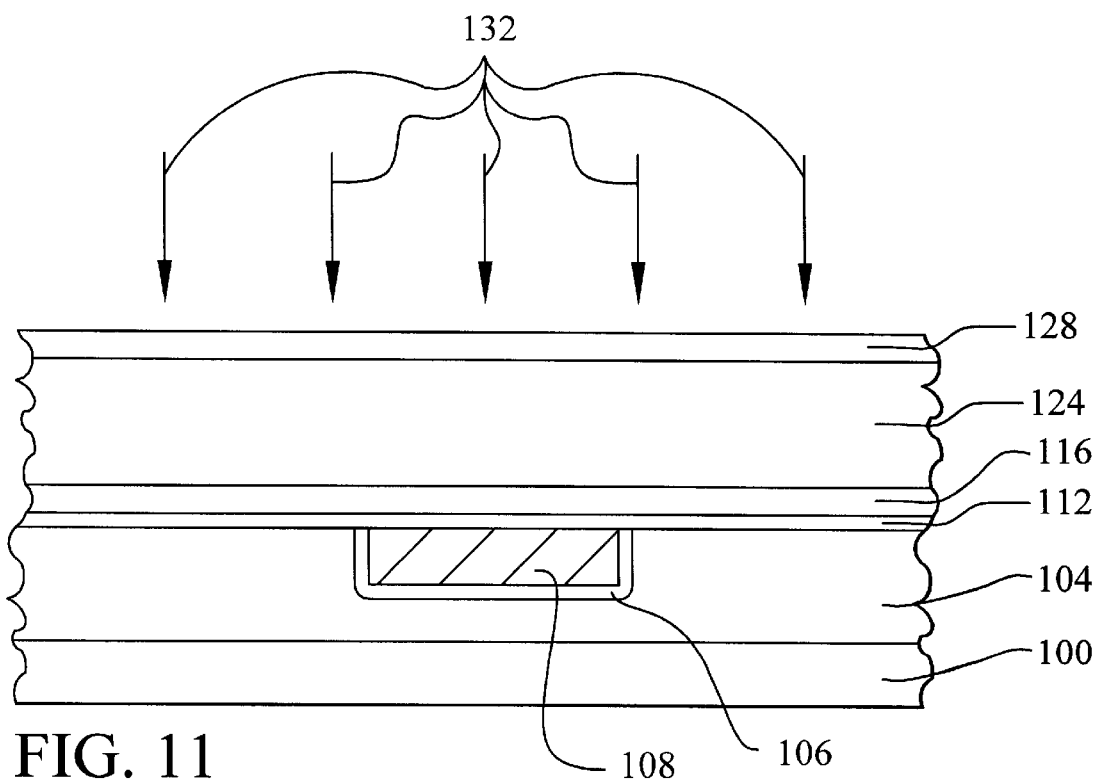

Referring now to FIG. 11, a second dielectric layer 124 is deposited overlying the first etch stop layer 116. The second dielectric layer 124 comprises a conventional silicon dioxide material. A second etch stop layer 128 is deposited overlying the second dielectric layer 124. The second etch stop layer 128 comprises silicon oxynitride deposited by plasma enhanced chemical vapor deposition (PE-CVD). The silicon oxynitride film is nitridized 132 by exposing the wafer to a $N_2$ plasma treatment. The $N_2$ plasma is preferably generated using mixed-frequency radio frequency (RF) energy. RF energy is used in bands at about 13.56 MHz and about 350 kHz. The preferred $N_2$ plasma treatment nitridizes and densifies the surface of the silicon oxynitride layer 128 to a depth of between about 300 Angstroms depending upon the treatment time.

The final thickness of the second etch stop layer 128 is between about 500 Angstroms and 1500 Angstroms. To achieve fully nitridized silicon oxynitride for the entire depth, the silicon oxynitride is deposited in several layers. Each layer is nitridized, then another layer is applied to build up the total thickness. This cycle may be repeated 2 to 5 times to complete the second etch stop layer 128. The nitridizing process causes the silicon oxynitride to become more resistant to silicon dioxide dry etching.

Figure 12:
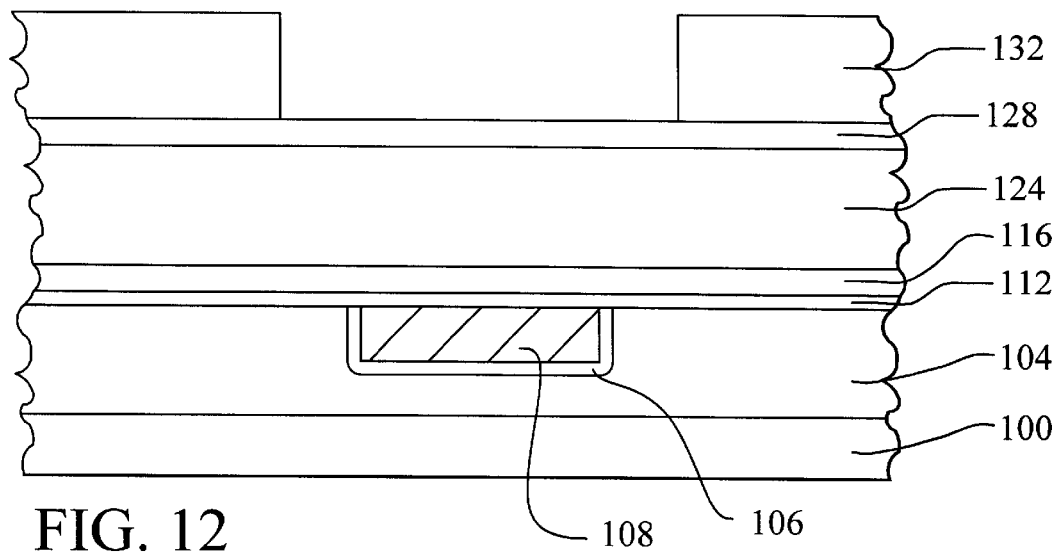

Referring now to FIG. 12, a third dielectric layer 132 is deposited overlying the second etch stop layer 128. The third dielectric layer 132 comprises a conventional silicon dioxide material. The third dielectric layer 132 is then patterned to form trenches for the planned second conductive traces. The second etch stop layer 128 stops the third dielectric layer 132 etch. The third dielectric layer 132 is etched using a conventional dry plasma etch.

Figure 13:
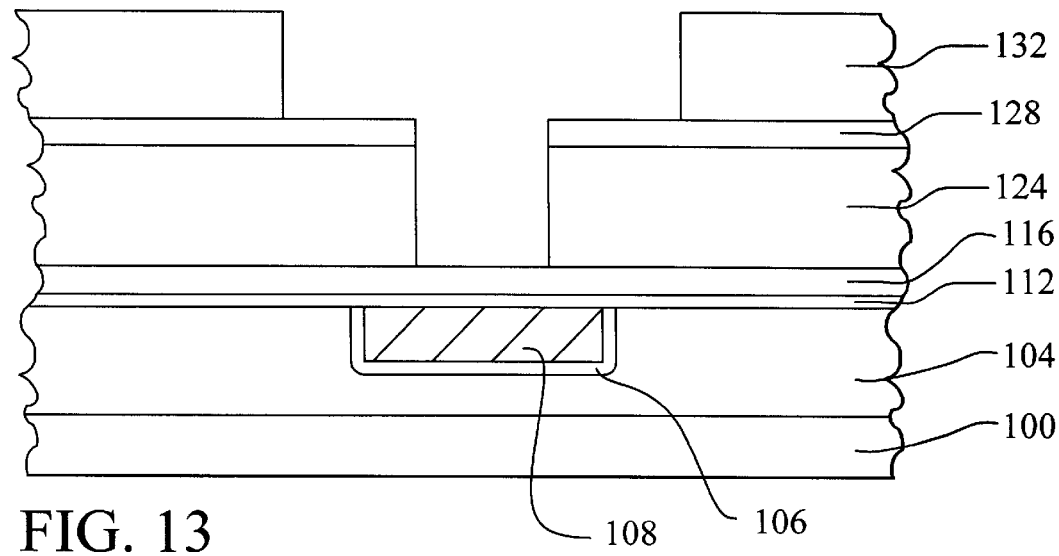

Referring now to FIG. 13, the second etch stop layer 128 and the second dielectric layer 124 are patterned to form vias. The first etch stop layer 116 stops the second dielectric layer 124 etch. The second dielectric layer 124 is etched using a conventional dry plasma etch.

Figure 14:
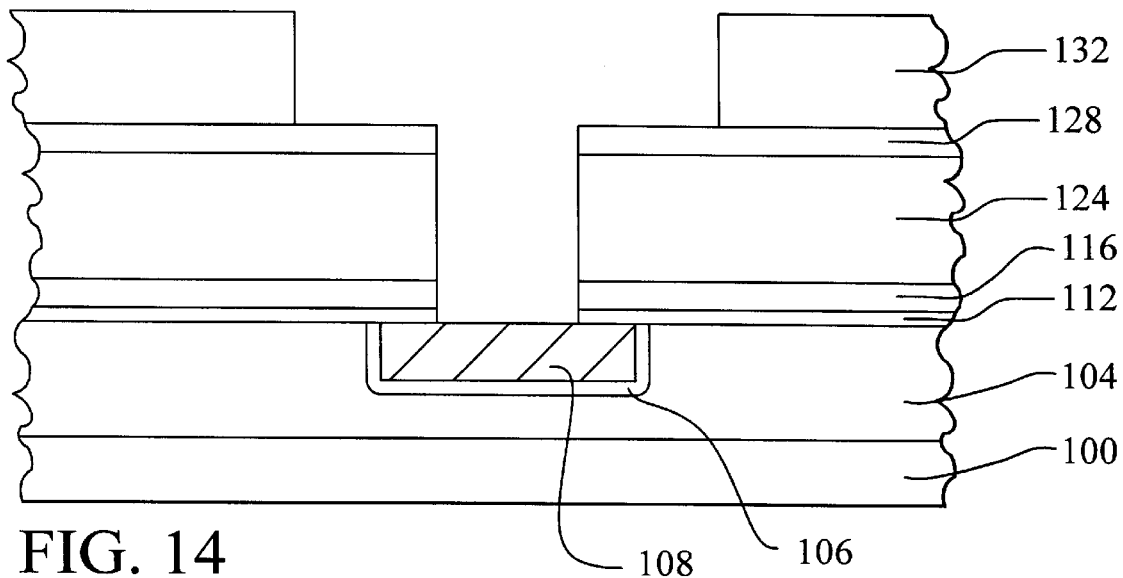

Referring now to FIG. 14, the first etch stop layer 116 and the diffusion barrier layer 112 are etched through to expose the first conductive traces 112. A conventional dry plasma etch is used to break through the first etch stop layer 116 and the diffusion barrier layer 112.

Figure 15:
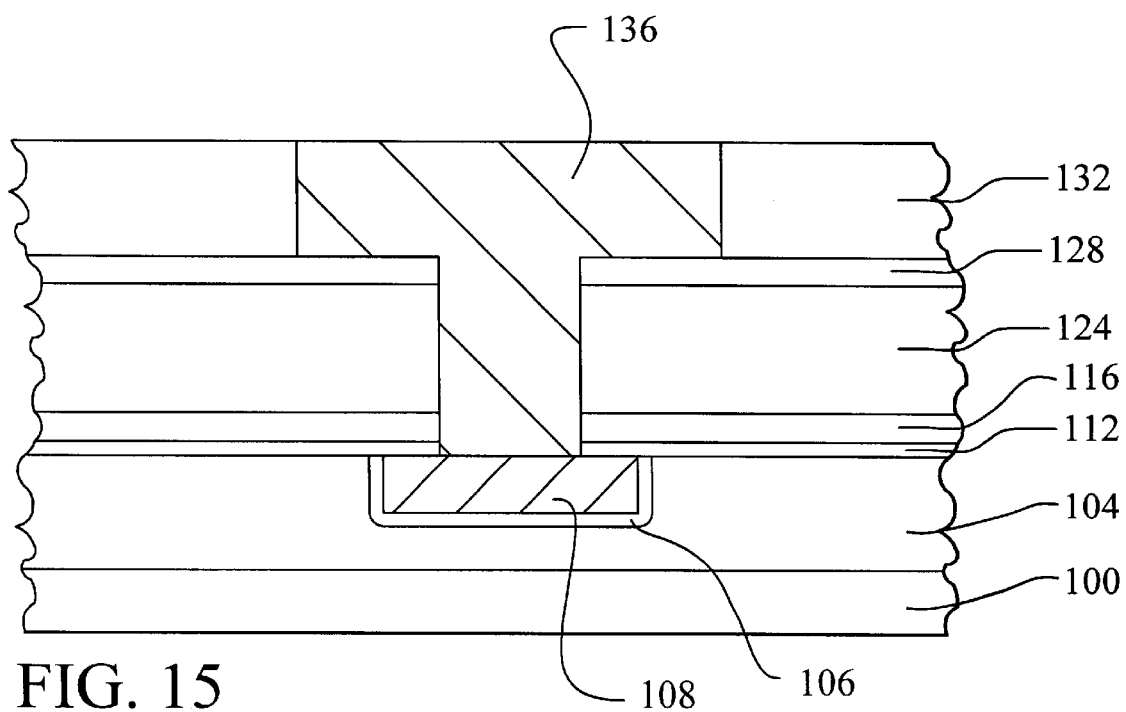

Referring now to FIG. 15, a metal layer 136 is deposited overlying the third dielectric layer 132 and filling the vias and trenches. The metal layer 136 comprises copper deposited by PVD, CVD, or plating. The metal layer 136 is polished down to complete the dual damascene interconnect, and the integrated circuit is completed.

The advantages of the present invention as shown in the second preferred embodiment can now be seen. First, the presence of the nitridized silicon oxynitride layer overlying the diffusion barrier allows a thinner silicon nitride layer for the diffusion barrier. This reduces the amount of capacitive coupling caused by the diffusion barrier. Second, by improving the silicon oxynitride material, it can be used for the second etch stop layer. This also reduces the capacitive coupling of the second etch stop layer.

The invention has been shown effective for improving the performance of silicon oxynitride for silicon dioxide etch stopping. A nitrogen plasma is used to nitridized the silicon oxynitride to and improve its characteristics.

While the invention has been particularly shown and described with reference to the preferred embodiments thereof, it will be understood by those skilled in the art that various changes in form and details may be made without departing from the spirit and scope of the invention.

What is claimed is:

1. A method to form dual damascene interconnects in the manufacture of an integrated circuit device comprising:

providing a semiconductor substrate;

providing first conductive traces in a first dielectric layer overlying said semiconductor substrate;

depositing a diffusion barrier layer overlying said first dielectric layer and said first conductive traces;

depositing a first etch stop layer overlying said diffusion barrier layer wherein said first etch step layer comprises silicon oxynitride;

nitridizing said first etch stop layer to decrease the etch rate of said first etch stop layer;

depositing a second dielectric layer overlying said diffusion barrier layer;

depositing a second etch stop layer overlying said second dielectric layer wherein said second etch stop layer comprises silicon oxynitride; nitridizing said second etch stop layer to decrease the etch rate of said second etch stop layer;

depositing a third dielectric layer overlying said second etch stop layer;

patterning said third dielectric layer to form trenches for planned second conductive traces wherein said second etch stop layer stops the etch process for said patterning;

patterning said second etch stop layer and said second dielectric layer to form vias;

etching through said first etch stop layer and said diffusion barrier layer to expose said first conductive traces;

depositing a metal layer overlying said third dielectric layer and filling said vias and said trenches;

polishing down said metal layer to complete said dual damascene interconnects; and completing said integrated circuit device.

2. The method according to claim 1 wherein said first etch stop layer is deposited to a thickness of between about 1000 Angstroms and 1500 Angstroms.

3. The method according to claim 1 wherein said step of depositing said second etch stop layer and said step of nitridizing said second etch stop layer are repeated to build up a required thickness of said second etch stop layer.

4. The method according to claim 1 wherein said step of depositing said first etch stop layer and said step of nitridizing said first etch stop layer are repeated to build up a required thickness of said first etch stop layer.

5. The method according to claim 1 wherein said step of nitridizing said first etch stop layer and said step of nitridizing said second etch stop layer are accomplished by treating said first etch stop layer and said second etch stop layer with $N_2$ plasma generated by mixed radio frequency energy bands of about 13.56 MHz and about 350 kHz.

6. The method according to claim 1 wherein said second etch stop layer is deposited to a thickness of between about 500 Angstroms and 1500 Angstroms.

* * * * *